(12) United States Patent
Venkataramanan et al.

(10) Patent No.: US 8,570,783 B2
(45) Date of Patent: Oct. 29, 2013

(54) LOW POWER CONTENT-ADDRESSABLE MEMORY AND METHOD

(75) Inventors: Ganesh Venkataramanan, Sunnyvale, CA (US); Kyle S. Viau, Fremont, CA (US); James Vinh, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 352 days.

(21) Appl. No.: 12/914,538

(22) Filed: Oct. 28, 2010

(65) Prior Publication Data

US 2012/0110256 A1    May 3, 2012

(51) Int. Cl.
*G11C 15/00*    (2006.01)

(52) U.S. Cl.
USPC ............... 365/49.17; 365/49.1; 365/49.15

(58) Field of Classification Search
USPC .................... 365/49.1, 49.15, 49.17
See application file for complete search history.

(56) References Cited

U.S. PATENT DOCUMENTS

| | | | | |
|---|---|---|---|---|
| 6,195,278 B1 * | 2/2001 | Calin et al. | ................. | 365/49.17 |
| 6,288,922 B1 * | 9/2001 | Wong et al. | ................. | 365/49.17 |
| 6,373,738 B1 * | 4/2002 | Towler et al. | ................ | 365/49.1 |
| 6,577,519 B1 * | 6/2003 | Avramescu | ............... | 365/49.15 |
| 6,760,242 B1 * | 7/2004 | Park et al. | .................. | 365/49.15 |
| 6,795,325 B1 * | 9/2004 | Inoue | ....................... | 365/49.17 |
| 6,906,937 B1 * | 6/2005 | Nataraj | ....................... | 365/49.1 |
| 7,057,913 B2 * | 6/2006 | Hsu et al. | ................... | 365/49.1 |
| 7,286,379 B1 * | 10/2007 | Sun | ............................. | 365/49.17 |
| 7,505,295 B1 * | 3/2009 | Nataraj et al. | ............... | 365/49.1 |
| 7,907,432 B2 * | 3/2011 | Deshpande et al. | ......... | 365/49.1 |
| 8,023,298 B1 * | 9/2011 | Park | ............................. | 365/49.1 |
| 8,233,302 B2 * | 7/2012 | Arsovski et al. | ........... | 365/49.17 |

OTHER PUBLICATIONS

"Improving Scalability and Complexity of Dynamic Scheduler through Wakeup-based Scheduling," Hsiao et al, IEEE 2006.

* cited by examiner

*Primary Examiner* — Viet Q Nguyen
(74) *Attorney, Agent, or Firm* — Volpe and Koenig, P.C.

(57) ABSTRACT

Content-Addressable Memory (CAM) arrays and related circuitry for integrated circuits and CAM array comparison methods are provided such that relatively low power is used in the operation of the CAM circuitry. A binary value pair is stored in a pair of CAM memory elements. A comparison signal is provided to comparator circuitry that uniquely represents the stored binary values. A match signal is input to the comparator circuitry that uniquely represents a binary value pair to be compared with the stored binary value pair. In one example, a transistor is operated to output a positive match result signal only on a condition that the comparison signal provided to the comparator circuitry and match signal input to the comparator circuitry represent the same binary value pair. In that example, no transistor of the comparator circuitry is operated when the comparison signal provided to the comparator circuitry and match signal input to the comparator circuitry represent different binary value pairs.

30 Claims, 4 Drawing Sheets

| | | Dest | SrcA | SrcB | SrcC | SrcD | |
|---|---|---|---|---|---|---|---|
| Ld P5, [Disp] | | P5 | | | | | ← QP1 |
| | ADD P20, P1, P5 | P20 | P1 | P5 | | | ← QP2 |
| | CLC P6 | P6 | | | | | ← QP3 |
| | ADC P21, P5, P20, P6 | P21 | P5 | P20 | P6 | | ← QP4 |
| ... | ... | ... | | | | | |
| Ld P15, [P4] | ADC P2, P15, P6, P21 | P2 | P6 | P4 | | P21 | ← QPn-2 |
| | | | | | | | ← QPn-1 |
| Ld P11, [P4 + P21] | ADC P22, P2, P11, P2 | P22 | P2 | P4 | P21 | P2 | ← QPn |
| AG Payload | ALU Payload | Wakeup | | | | | |

LOW POWER CONTENT-ADDRESSABLE MEMORY AND METHOD

FIELD OF INVENTION

The present invention is generally directed to integrated circuits and in particular, to integrated circuits having Content-Addressable Memory (CAM) and related methods.

BACKGROUND

Integrated circuits that include Content-Addressable Memories (CAMs) are well known in the art. CAM circuitry compare input search data against data stored in CAM arrays and identify whether or not the input data matches the data stored in one or more of the memory arrays.

In one type of application, CAMs are used in connection with processor schedulers that schedule the execution of processor instructions/operations. Schedulers are known that use wakeup logic to trace instruction dependence and wakes instructions up when their source operands become available. Wakeup logic can be implemented by using CAMs that fully match all the source tags in an issue window with result tags.

Relatively high power consumption by CAMs can become problematic and can lead to overheating concerns as well as battery life concerns for battery operated devices. As reported by K. S. Hsiao and C. H. Chen, "Improving Scalability and Complexity of Dynamic Scheduler through Wakeup-Based Scheduling," *Proc. Int'l Conf. Computer Design*, October 2006, "As for the power consideration, the power consumption associated with the CAM-based scheduler constitutes a significant portion of the processor power consumption and may lead to costly cooling system. For example, the issue logic is the most power hungry component of the Compaq Alpha 21464 processor; it is responsible for 46% of the total processor power. Similarly, the out-of-order scheduler of the Intel Pentium 4 processor accounts for 40% of the total power consumption. The wakeup logic dominates the most power consumption of the dynamic scheduler."

SUMMARY OF EMBODIMENTS OF THE INVENTION

Content-Addressable Memory (CAM) arrays and related circuitry for Integrated Circuits (ICs) and CAM array comparison methods are provided such that relatively low power is used in the operation of the CAM circuitry.

The CAM circuitry is configured to compare input search data against data stored in CAM arrays and identify whether or not the input data matches the data stored in one or more of the arrays. The CAM circuitry is configured with logic circuitry that matches pairs of array data bits against representations of pairs of input data bits. The array data bit pairs and input data bit pairs define binary data pairs that are preferably mapped to a set of four binary vectors corresponding to (0001), (0010), (0100) and (1000). The comparison is preferably conducted such that significant power is used only when the respective binary data pairs match.

In a preferred implementation, CAMs according to the invention are provided for a processor core that has an execution unit having multiple pipelines for executing micro-instructions/operations where each pipeline is configured to execute a selected set of operations. The execution unit preferably includes a scheduler queue configured to queue instructions for processing by an appropriate pipeline. The queued instructions preferably correspond to sets of instruction data received from a decode and dispatch unit.

The queue preferably includes a predetermined number of CAM arrays associated with each queue position. Preferably each CAM array is configured to store an address of a data register that may be required for a queued instruction such that when an address is stored in a CAM array for a queued instruction appropriate data is required to be stored in the register indicated in the stored address before directing the queued instruction to a pipeline for execution. The scheduler is preferably configured to monitor for an indication that the appropriate data has been stored in the data register indicated by the address stored in the respective CAM array for a queued instruction by performing a matching operation based on pairs of CAM bits.

DETAILED DESCRIPTION OF PREFERRED EMBODIMENT(S)

Figure 1:
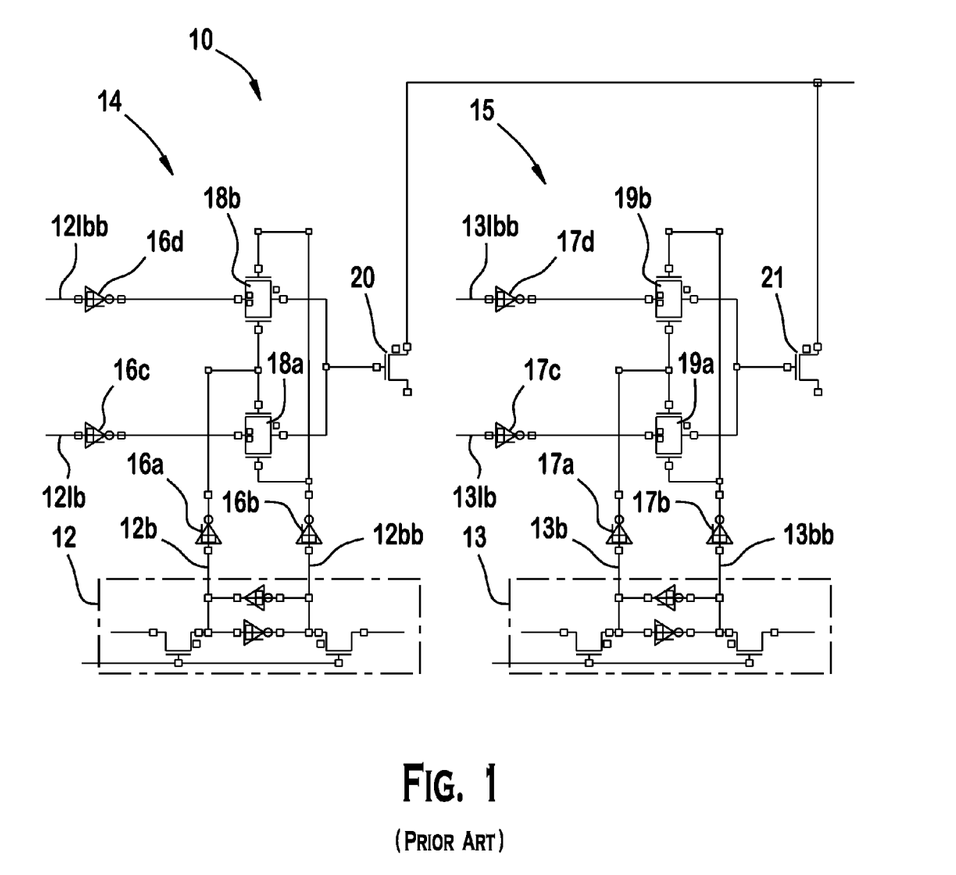
FIG. 1 is a circuit diagram of two memory elements of a CAM array that are configured for individual comparison for match or mismatch.

Referring to FIG. 1, a portion of a conventional "mismatch" Content-Addressable Memory (CAM) circuit 10 is shown with respect to two conventional memory elements 12, 13 of a CAM array from which extend bit and bit bar lines, 12*b*, 13*b* and 12*bb*, 13*bb*, respectively. Typically, the memory elements are Static random access memory (SRAM) cells. Each memory element 12, 13 is respectively associated with bit and bit bar input lines, 12Ib, 13Ib and 12Ibb, 13Ibb, via a CAM comparison circuit 14, 15. The respective input lines 12Ib, 12Ibb and 13Ib, 13Ibb input data that is compared by the respective comparison circuit 14, 15 with the content of the respective memory cell 12, 13.

For each memory element 12, 13, the respective CAM comparison circuit 14, 15, includes four inverters 16*a-d*, 17*a-d*, first and second CMOS (Complementary metal-oxide-semiconductor) transmission gates 18*a-b*, 19*a-b* and an NMOS (n-channel enhancement-type Metal-Oxide-Semiconductor field-effect) transistor 20, 21, respectively.

One inverter 16*a-d*, 17*a-d* is associated with each of the bit and bit bar lines 12*b*, 12*bb*, 12Ib, 12Ibb, 13*b*, 13*bb*, 13Ib, 13Ibb that are coupled to the respective CAM comparison circuits 14, 15 to provide circuit isolation. The CMOS transmission gates 18*a-b*, 19*a-b* of each respective CAM comparison circuit 14, 15 are coupled to the bit and bit bar lines, 12*b*, 12*bb*, 13*b*, 13*bb*, of the respective memory element 12, 13 in a manner to control the first gate 18*a*, 19*a* to be an opposite state than the second gate 18*b*, 19*b*. Whether the first gate 18*a*, 19*a* is open and the second gate 18*b*, 19*b* is closed or whether the first gate 18*a*, 19*a* is closed and the second gate 18*b*, 19*b* is open is dependent upon the value stored in the respective memory element 12, 13.

The first CMOS transmission gate 18a, 19a of each respective CAM comparison circuit 14, 15 is coupled to the bit input line 12Ib, 13Ib, associated with the respective memory element 12, 13 to enable a control signal to pass to the respective NMOS transistor 20, 21 when the first CMOS transmission gate 18a, 19a is open and to not allow a control signal to pass to the respective NMOS transistor 20, 21 when the first CMOS transmission gate 18a, 19a is closed.

The second CMOS transmission gate 18b, 19b of each respective CAM comparison circuit 14, 15 is coupled to the bit bar input line 12Ibb, 13Ibb, associated with the respective memory element 12, 13 to enable a control signal to pass to the respective NMOS transistor 20, 21 when the second CMOS transmission gate 18b, 19b is open and to not allow a control signal to pass to the respective NMOS transistor 20, 21 when the second CMOS transmission gate 18b, 19b is closed.

When a "0" is stored in one of the memory elements 12, 13, the bit line 12b, 13b is "low" i.e. "0" and the bit bar line 12bb, 13bb is "high" i.e. "1." When a "1" is stored in one of the memory elements 12, 13, the bit line 12b, 13b is "high" i.e. "1" and the bit bar line 12bb, 13bb is "low" i.e. "0." When a comparison is to be made, if the input value for comparison is "0," the bit input line 12Ib, 13Ib is set "low" i.e. "0" and the bit bar input line 12Ibb, 13Ibb is set "high" i.e. "1." If the input value for comparison is "1," the bit bar input line 12Ibb, 13Ibb is set "low" i.e. "0" and the bit input line 12Ib, 13Ib is set "high" i.e. "1."

The input line settings are inverted via passing through the inverters 16c, 16d, 17c, 17d to reach the CMOS transmission gates 18a-b, 19a-b, so that a "low" i.e. "0" setting on an input line serves as a control signal at the respective CMOS transmission gate 18a-b, 19a-b, if the gate is open for it to pass to the NMOS transistor 20, 21. A "high" i.e. "1" setting on an input line is inverted when it reaches the respective CMOS transmission gate 18a-b, 19a-b, so a "high" i.e. "1" setting on an input line does not serve as a control signal for the respective NMOS transistor 20, 21 even if the gate is open.

The respective CAM comparison circuits 14, 15 operate such that a control signal is passed to operate the NMOS transistors 20, 21 to send a mismatch signal when either or both of the memory elements 12, 13 do not match the respective input values. The NMOS transistors 20, 21 of the CAM comparison circuits 14, 15 are coupled to each other and to similar NMOS transistors of other CAM comparison circuits (not shown) within a CAM array such that a mismatch indication for the CAM array is provided if any of the NMOS transistors sends a mismatch signal. Only if no mismatch signal is sent by the NMOS transistors of the CAM comparison circuits within the CAM array will a CAM array match indication be provided for a given comparison.

Where a value of "0" is stored in memory element 12, CMOS transmission gate 18a will be closed and CMOS transmission gate 18b will be open. Thus if the if the input value for comparison is "0," the "low" i.e. "0" on setting on the bit input line 12Ib will not cause the NMOS transistor 20 to operate because transmission gate 18a is closed. However, if the if the input value for comparison is "1," the "low" i.e. "0" on setting on the bit bar input line 12Ibb will cause the NMOS transistor 20 to operate to send a mismatch signal because transmission gate 18b is open.

Where a value of "1" is stored in memory element 12, CMOS transmission gate 18a will be open and CMOS transmission gate 18b will be closed. Thus if the if the input value for comparison is "1," the "low" i.e. "0" on setting on the bit bar input line 12Ibb will not cause the NMOS transistor 20 to operate because transmission gate 18b is closed. However, if the if the input value for comparison is "0," the "low" i.e. "0" on setting on the bit input line 12Ib will cause the NMOS transistor 20 to operate to send a mismatch signal because transmission gate 18a is open.

Where a value of "0" is stored in memory element 13, CMOS transmission gate 19a will be closed and CMOS transmission gate 19b will be open. Thus if the if the input value for comparison is "0," the "low" i.e. "0" on setting on the bit input line 13Ib will not cause the NMOS transistor 21 to operate because transmission gate 19a is closed. However, if the if the input value for comparison is "1," the "low" i.e. "0" on setting on the bit bar input line 13Ibb will cause the NMOS transistor 21 to operate to send a mismatch signal because transmission gate 19b is open.

Where a value of "1" is stored in memory element 13, CMOS transmission gate 19a will be open and CMOS transmission gate 19b will be closed. Thus if the if the input value for comparison is "1," the "low" i.e. "0" on setting on the bit bar input line 13Ibb will not cause the NMOS transistor 21 to operate because transmission gate 19b is closed. However, if the if the input value for comparison is "0," the "low" i.e. "0" on setting on the bit input line 13Ib will cause the NMOS transistor 21 to operate to send a mismatch signal because transmission gate 19a is open.

Each time a comparison is made that does not match the pair of values stored in the two memory elements 12, 13, at least one of the NMOS transistors 20, 21 is operated to send a mismatch signal. This results in a significant amount of power being dissipated, i.e., used, as compared to when a comparison is made and both memory values match.

Figure 2:
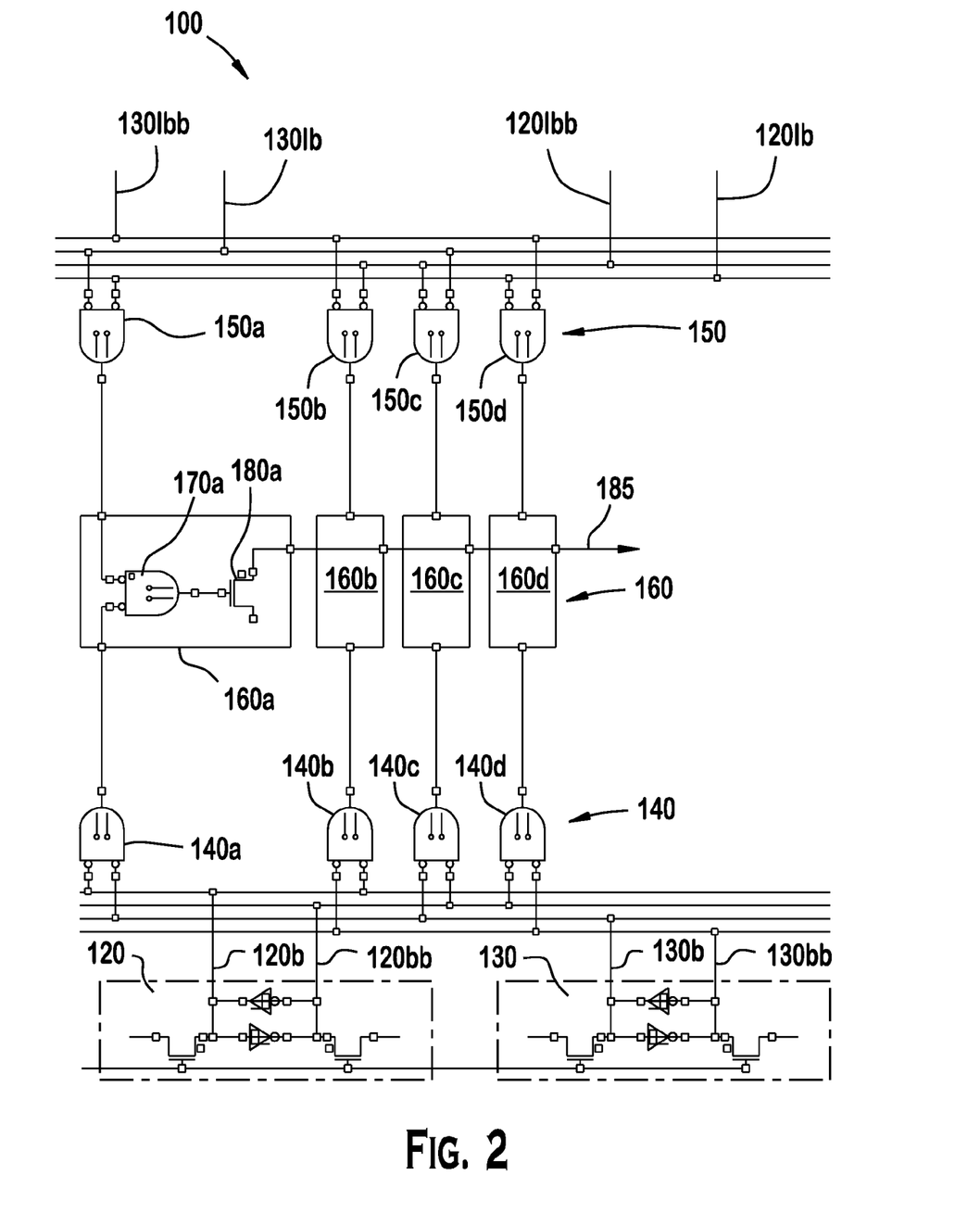
FIG. 2 is a circuit diagram of two memory elements of a CAM array that are configured for a paired comparison for match or mismatch in accordance with an embodiment of the present invention.

Referring to FIG. 2, a first example of a "match" CAM circuit 100 in accordance with the present invention is shown with respect to a pair of memory elements 120, 130 of a CAM array. Preferably, the memory elements 120, 130 are static random access memory (SRAM) cells. The match CAM circuit 100 includes decoder circuitry 140, input encoder circuitry 150 and comparator circuitry 160.

The decoder circuitry 140 is configured to provide a comparison signal to comparator circuitry 160 that uniquely represents a binary value pair stored in the memory elements 120, 130. The input encoder circuitry 150 is configured to input a match signal to the comparator circuitry 160 that uniquely represents a binary value pair to be compared with the stored binary value pair. The comparator circuitry 160 is configured to operate a transistor to output a positive match result signal only on a condition that the comparison signal provided to the comparator circuitry 160 and match signal input to the comparator circuitry 160 represent the same binary value pair.

No transistor of the comparator circuitry 160 is operated when the comparison signal provided to the comparator circuitry 160 and match signal input to the comparator circuitry represent different binary value pairs. This results in significant savings in operational power over prior art CAM circuits where an NMOS transistor is operated each time a mismatch of any single value occurs. The NMOS transistors 20, 21 of mismatch CAM circuit of FIG. 1 will operate to send a mismatch signal once where there is one mismatch and twice where both memory elements mismatch. Thus, the power usage is statistically four times greater than the presently disclosed match CAM circuit.

For example, for match CAM circuit 100 of FIG. 2, for a stored binary value pair of (0,0), there is one NMOS transistor operation when a representation of the binary value (0,0) is input and no NMOS transistor operation when any other value pair is input. However, for the mismatch CAM circuit 10 of FIG. 1, for a stored binary value pair of (0,0), there is no NMOS transistor operation when a representation of the binary value (0,0) is input, but one NMOS transistor operation when either (0,1) or (1,0) is input and two NMOS transistor operations when (1,1) is input.

In context, this power savings becomes very significant. A typical a CAM array comparison operation may be conducted in less than one clock cycle and be made for multiple CAM arrays for nearly every clock cycle of operation of a processor when it is executing instructions and operations. Accordingly, the effect of even a small power savings in the operation of a CAM comparison of a pair of memory elements is dramatically multiplied when considering the number of CAM pair comparisons made during processor operation. For example, a core processor scheduler that operates in at a 2-4 GHz speed having a 40 position queue with four wake up CAMs per queue position, i.e. 160 wake up cams, each having four memory element pairs, i.e. 640 memory element pairs, there will be well over a trillion memory element pair comparisons made during a typical second of core processor operation with respect to the wake up CAMs.

Referring to the details of FIG. 2, a pair of bit and bit bar lines, 120$b$, 130$b$ and 120$bb$, 130$bb$ extend from each memory element 120, 130, respectively. The pair of memory elements 120, 130 are associated with a pair of input lines, each defined by bit and bit bar input lines 120Ib, 120Ibb and 130Ib, 130Ibb, via the match CAM circuit 100 such that when a representation of a binary value pair is input via the bit and bit bar input lines, a match result indication is output on the condition that the input binary value pair representation matches the binary value pair stored in the pair of memory elements 120, 130.

The bit and bit bar lines, 120$b$, 130$b$ and 120$bb$, 130$bb$, of the pair of memory elements 120, 130 are coupled to AND gates 140$a$, 140$b$, 140$c$, 140$d$ of the decoder circuit 140. The decoder AND gates 140$a$, 140$b$, 140$c$, 140$d$ preferably include input inverters to provide circuit isolation between the pair of memory elements 120, 130 and the decoder circuit 140. Outputs of the four decoder AND gates 140$a$, 140$b$, 140$c$, 140$d$ define four comparison lines that are respectively coupled to comparators 160$a$, 160$b$, 160$c$, 160$d$ of the comparator circuit 160.

The bit and bit bar input 120Ib, 130Ib and 120Ibb, 130Ibb, of the pair of input lines are coupled to AND gates 150$a$, 150$b$, 150$c$, 150$d$ of the encoder circuit 150. The encoder AND gates 150$a$, 150$b$, 150$c$, 150$d$ preferably include input inverters to provide circuit isolation between the input lines and the encoder circuit 150. Outputs of the four encoder AND gates 150$a$, 150$b$, 150$c$, 150$d$ define four match lines that are respectively coupled to comparators 160$a$, 160$b$, 160$c$, 160$d$.

As only shown for comparator circuit 160$a$, the comparators 160$a$, 160$b$, 160$c$, 160$d$ each include an AND gate 170$a$ that has inputs coupled to the comparison line of the respective decoder AND gate 140$a$ and to the match line of the respective encoder AND gate 150$a$. The comparator AND gate 170$a$ has an output coupled to control the operation of an NMOS transistor 180$a$ that is configured to output a positive match value signal when it is operated.

Each comparator 160$a$, 160$b$, 160$c$, 160$d$ may include an NMOS transistor 180$a$ that outputs the positive match value signal to a common output line 185 of comparator circuit 160 when it is operated as shown in FIG. 2. Alternatively, in lieu of each comparator 160$a$, 160$b$, 160$c$, 160$d$ having an NMOS transistor, the outputs of the comparator AND gates may be coupled, preferably via a logical OR coupling, to a single NMOS transistor that outputs the positive match value signal from the comparator circuit 160 (not shown). Where the outputs of the comparator AND gates are coupled via a logical OR coupling, in some applications, it may be possible to eliminate the NMOS transistor and output the result of the logical OR coupling to indicate whether of not there is a match.

The decoder circuit 140 is configured to produce a comparison value on one of the comparison lines for any given binary value pair stored in the pair of memory elements 120, 130. Similarly, the encoder circuit 150 is configured to produce a match value on one of the match lines for any given binary value pair to be compared.

The comparator circuits 160$a$, 160$b$, 160$c$, 160$d$ are configured to generate a positive match result value from one of the comparator AND gates on a condition that the comparison line for that circuit has been provided with the comparison value and the match line for that circuit has been provided with the match value. The generation of the positive match result value from one of the comparator AND gates causes the NMOS transistor associated with the AND gate to output a positive match value signal.

As explained below, the output of a positive match result value from a comparator AND gates will only occur for one of the comparators when the pair of values stored in the pair of memory elements 120, 130 matches the represented binary value pair that is input. Otherwise, the NMOS transistors 180$a$ of the comparator circuits 160$a$, 160$b$, 160$c$, 160$d$ will not be operated.

When a "0" is stored in one of the memory elements 120, 130, the bit line 120$b$, 130$b$ is "low" i.e. "0" and the bit bar line 120$bb$, 130$bb$ is "high" i.e. "1." When a "1" is stored in one of the memory elements 120, 130, the bit line 120$b$, 130$b$ is "high" i.e. "1" and the bit bar line 120$bb$, 130$bb$ is "low" i.e. "0." As a result, the stored values of the pair of memory elements 120, 130 is decoded into one of four vectors (1,0,0,0), (0,1,0,0), (0,0,1,0) or (0,0,0,1) that is output on the four comparison lines from the decoder AND gates 140$a$, 140$b$, 140$c$, 140$d$.

For example, when a (0,0) binary value pair is stored in pair of the memory elements 120, 130, the bit lines 120$b$, 130$b$ are both "low" i.e. "0" and the bit bar lines 120$bb$, 130$bb$ are both "high" i.e. "1." As a result, "0"s are input to both inverter inputs of decoder AND gate 140$a$ resulting in an output value "1" and at least one "1" is input to one of the inverter inputs of the other three decoder AND gates 140$b$, 140$c$, 140$d$ resulting in an output value "0". Thus, the stored value (0,0) in the pair of memory elements 120, 130, is decoded into the vector (1,0,0,0) being output on the four comparison lines from decoder AND gates 140$a$,140$b$, 140$c$, 140$d$. Accordingly, for the stored value (0,0), decoder AND gate 140$a$ produces a "1" that serves as the comparison value input to the comparator AND gate 170$a$ which effectively enables comparator 160$a$ to make a comparison with a match value and decoder AND gates 140$b$ 140$c$, 140$d$ all produce a "0" that do not enable any of the other comparators 160$b$, 160$c$, 160$d$ to make comparisons.

When the representation of a binary value pair is input for comparison, "0" is represented by the bit input line 120Ib, 130Ib set as "low" i.e. "0" and the bit bar input line 120Ibb, 130Ibb set as "high" i.e. "1" and a "1" is represented by the bit input line 120Ib, 130Ib set as "high" i.e. "1" and the bit bar input line 120Ibb, 130Ibb set as "low" i.e. "0." As a result, the input binary value pairs are encoded into one of four vectors (1,0,0,0), (0,1,0,0), (0,0,1,0) or (0,0,0,1) that is output on the four match lines from the encoder AND gates 150$a$, 150$b$, 150$c$, 150$d$.

For example, when the binary value pair (0,0) is to be compared to a stored binary value pair, the bit input lines 120Ib, 130Ib are both "low" i.e. "0" and the bit bar input lines 120Ibb, 130Ibb are both "high" i.e. "1." As a result, "0"s are input to both inverter inputs of encoder AND gate 150a resulting in an output value "1" and at least one "1" is input to one of the inverter inputs of the other three encoder AND gates 150b, 150c, 150d resulting in an output value "0". Thus, the binary value pair (0,0) is encoded into the vector (1,0,0,0) that is output on the four match lines from respective encoder AND gates 150a,150b, 150c, 150d. Accordingly, for the binary value pair (0,0), encoder AND gate 150a produces a "1" that serves as the match value input to the comparator AND gate 170a which effectively enables comparator 160a to make a comparison. Encoder AND gates 150b 150c, 150d all produce a "0" so that if one of the other comparators 160b, 160c, 160d is enabled by being provided with the comparison value, no positive match value is generated by the other comparator's AND gate.

For any binary value pair other than (0,0), the encoder AND gate 150a produces a "0" that does not serve as the match value input to the comparator AND gate 170a and prevents the generation of a positive match value by AND gate 170a. Thus only when the stored binary value pair is (0,0) and the binary value pair to be compared is also (0,0) will a positive match value be generated by the comparator AND gate 170a. Similarly, only when the stored binary value pair is (0,1) and the binary value pair to be compared is also (0,1) will a positive match value be generated by the AND gate of comparator 160b; only when the stored binary value pair is (1,0) and the binary value pair to be compared is also (1,0) will a positive match value be generated by the AND gate of comparator 160c; and only when the stored binary value pair is (1,1) and the binary value pair to be compared is also (1,1) will a positive match value be generated by the AND gate of comparator 160d.

Figure 3:
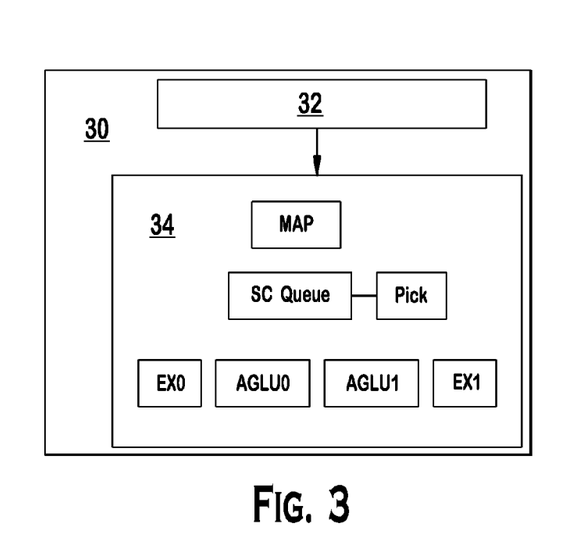
FIG. 3 is a block diagram of a processor core and execution unit thereof configured to utilize CAMs in accordance with an embodiment of the present invention.

Referring to FIGS. 3, 4, 5a and 5b, another example of an embodiment of the invention is illustrated in the context of a processor core 30 of a multi-core Integrated Circuit (IC). As illustrated in FIG. 3, the processor core 30 has a Decoder unit 32 that decodes and dispatches microinstructions to an Execution Unit 34. Multiple Execution Units may be provided for multi-thread operation. The Execution Unit 34 includes a Mapper MAP associated with a scheduler queue SC Queue and a picker PICK.

Four pipelines are provided for executing queued operations. A first arithmetic pipeline EX0 and a first address generation pipeline AGLU0 are associated with a first set of registers PRN0 in which data is stored relating to execution of specific operations by those two pipelines. A second arithmetic pipeline EX1 and a second address generation pipeline AGLU1 are associated with a second set of registers PRN1 in which data is stored relating to execution of specific operations by those two pipelines. Preferably there are 96 data registers in each of the first and second sets of registers, PRN0, PRN1. In operation, when one of the pipelines writes data to one of the registers in either the first or second sets of registers, PRN0, PRN1, the same date is preferably also written to the corresponding register in the other set. In this manner the data stored in the first set of register, PRN0, is maintained the same as the data stored in the second set of register, PRN1

Preferably, the arithmetic pipelines are asymmetric such that the first arithmetic pipeline EX0 is the only one configured to process divide operations and count leading zero operations and the second arithmetic pipeline EX1 is the only one configured to process multiplication operations and branch operations within the Execution Unit 34.

The Mapper MAP receives the instructions from the Decoder unit 30 and selectively inputs the instructions into queue positions in the scheduler queue. The picker PICK picks instructions from the scheduler queue SC Queue when they are ready for execution and selectively directs them one of the pipelines.

Figure 4:
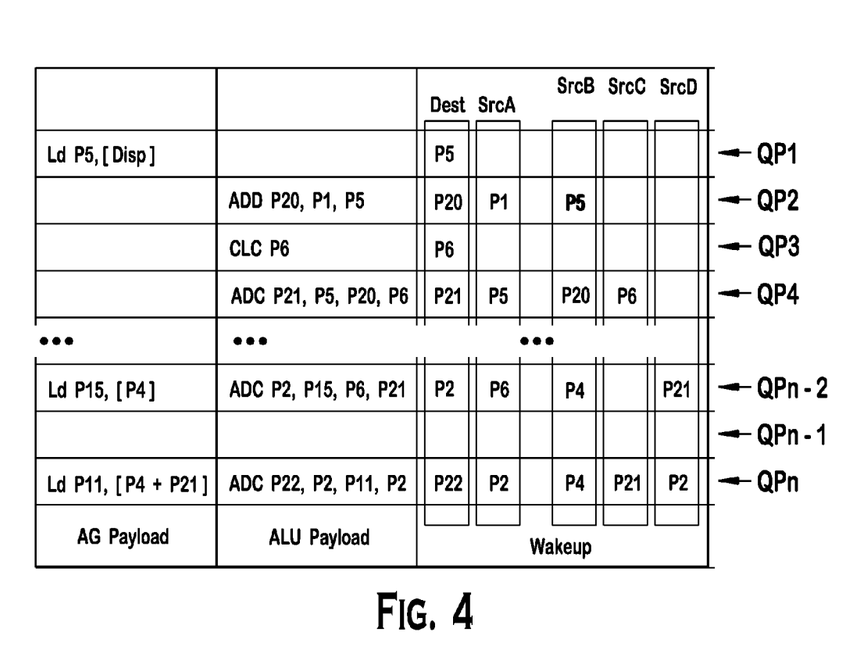
FIG. 4 is a block diagram of a scheduler of the execution unit of the processor core of FIG. 3.

Referring to FIG. 4, a block diagram of the scheduler queue SC Queue illustrates a plurality of queue positions QP1 . . . QPn. Each queue position QP1 . . . QPn is associated with memory fields for an Address Generation instruction (AG Payload), an Arithmetic/Logic instruction (ALU Payload), four Wake Up CAMs (ScrA, ScrB, ScrC, ScrD) and a destination CAM (Dest). The scheduler preferably has 40 positions and, accordingly 160 Wake Up CAMs.

The Mapper (MAP) is configured to fill a position of the scheduler queue with a specific instruction that may be an Address Generation instruction, an Arithmetic/Logic instruction, or a combination of both that is stored in AG Payload and/or ALU Payload memory fields, accordingly. In addition, the Mapper stores to the queue position Wake Up CAMs up to four addresses of the first and second sets of data registers from which data is to be used to perform the respective instruction and stores to the queue position Destination CAM an address of a data register where data resulting from execution of the respective instruction is to be stored.

With 96 data registers being associated with each of the first and second sets of registers, PRN0, PRN1, each register within a set can be uniquely addressed by a 7-bit binary address. Preferably, the CAMs each include four pairs of memory elements defining eight-bit CAM arrays of which seven bits are used for storing register addresses. The eighth bit is preferably used for RAS (reasons to store) parity indicator for of the 7 bit register address. Such a parity bit helps to protect against a one bit flip due to soft errors which are caused by events such as cosmic ray strikes.

The picker (Pick) is configured to pick an instruction mapped to a scheduler queue position when the respective Wake Up CAMs indicate that the data register contains the data needed for execution of the instruction. For example, queue position QP2 has been filled with an ADD instruction where the contents of a register having an address P1 is to be added with the content of a register having an address P5 and the result stored in a register having the address P20. As noted above, the same data is preferably stored in each set of registers PRN0, PRN1, so that when the instruction in queue position QP2 is executed by either pipeline EX0 or EX1, the result is stored in register P5 of both sets of registers PRN0, PRN1.

When required data is stored in one of the registers, a comparison operation is conducted by the Wake Up CAMs to "wake up" any Wake Up CAMs having that register's address. In this case, Wake Up CAMs ScrA and ScrB for queue position QP2, respectively await the storing of data to the registers having addresses P1 and P5, and are awaken when a comparison operation is conducted for those register addresses.

For a combined Address Generation and Arithmetic/Logic instruction, the picker (Pick) is configured to pick the queued instruction twice. For example, queue position QPn-2 has been filled with a Load (Ld) Instruction combined with an Add-with-Carry (ADC) instruction where the contents of a register having an address P4 is to be loaded in a register having an address P15 and then the ADC portion of the instruction is to be performed with respect to the contents of the P15 register and the content of registers having addresses P6 and P21 with the result stored in a register having the address P2. In this case, when the Wake Up CAM ScrB for queue position QPn-2 is awaken, the Load portion of the instruction can then picked. Thereafter, the picker awaits the wake up of CAMs ScrA and ScrD for queue position QPn-2 that reflects the storing of data to the registers having addresses P6 and P21 before picking queue position QPn-2 a second time to perform the ADC portion of the instruction. Where the picker picks an Address Generation instruction or the Address Generation portion of a combined instruction, the picked item is directed to the Address generation unit (AGLU0, ALGU1) of one of the two execution threads.

Figure 5A:
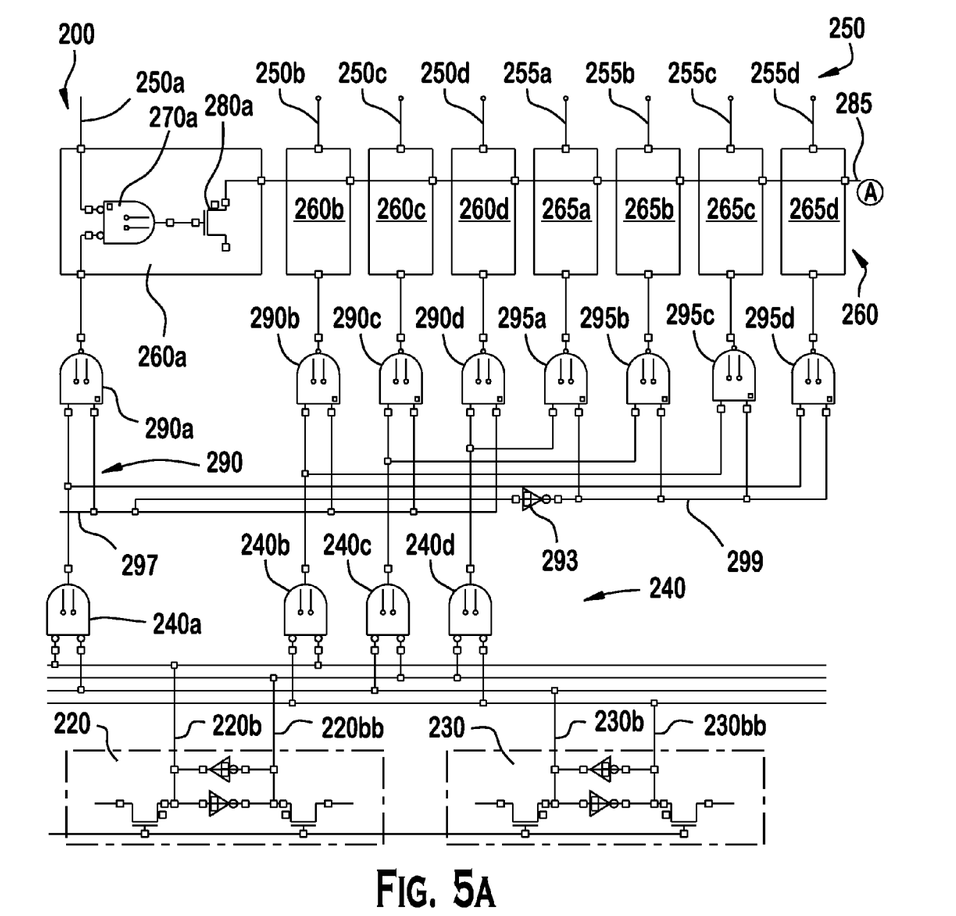
FIGS. 5A and 5B is a circuit diagram, in two parts of a CAM array of the scheduler of FIG. 4 of the execution unit of FIG. 3 that is configured for paired match comparison in accordance with an embodiment of the present invention.
Figure 5B:
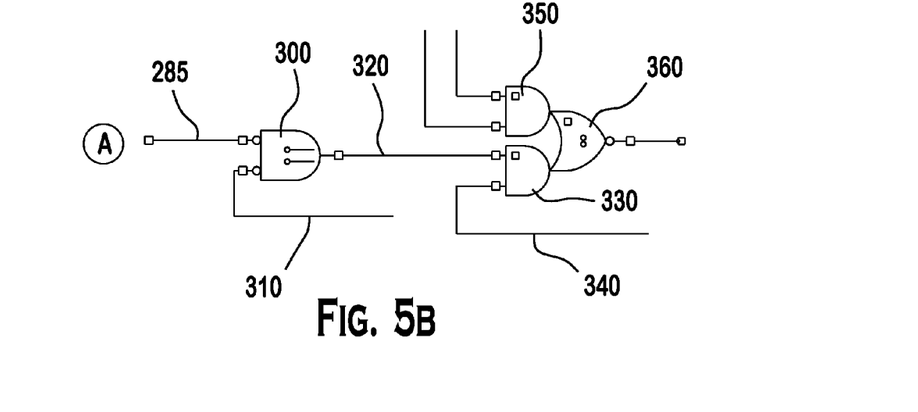

Referring to FIGS. 5a and 5b, an example of a match CAM circuit 200 is illustrated for the Wake Up CAMs of the scheduler queue depicted in FIGS. 3 and 4. The match CAM circuit 200 continues from A of FIG. 5a to A of FIG. 5b and is illustrated in detail with respect to one pair of memory elements 220, 230 of a CAM array having eight elements, i.e. four pairs of array elements. The pair of memory elements 220, 230 is associated with decoder circuitry 240, encoded match lines 250, comparator circuitry 260 and multiplexor selection circuitry 290. Preferably, the memory elements 220, 230 are static random access memory (SRAM) cells.

The decoder circuitry 240 is configured to provide a comparison signal to comparator circuitry 260 that uniquely represents a binary value pair stored in the memory elements 220, 230. The comparison signal is directed to one of two sets of comparators, 260a-d and 265a-d of comparison circuitry via multiplexor selection circuitry 290.

The encoded match lines 250 are configured to input a match signal to the comparator circuitry 260 that uniquely represents a binary value pair to be compared with the stored binary value pair. The encoded match lines 250 are divided into two sets 250a-d and 255a-d which are coupled respectively to the two sets of comparators, 260a-d and 265a-d of comparison circuitry 260. A match signal can be input from either set of match lines 250a-d, 255a-d.

The comparator circuitry 260 is configured to operate a transistor to output a positive match result signal only on a condition that the comparison signal provided to a selected set of comparators 260a-d, 265a-d of the comparator circuitry 260 and a match signal input to the selected set of comparators 260a-d, 265a-d represent the same binary value pair.

No transistor of the comparator circuitry 260 is operated when the comparison signal provided to the selected set of comparators 260a-d, 265a-d and the match signal input to the selected set of comparators 260a-d, 265a-d represent different binary value pairs. This results in significant savings in operational power over prior art CAM circuits where an NMOS transistor is operated each time a mismatch of any single value occurs.

Referring to the details of FIG. 5a, a pair of bit and bit bar lines, 220b, 230b and 220bb, 230bb extend from each memory element 220, 230, respectively. The pair of memory elements 220, 230 are associated with the two sets of match lines 250a-d, 255a-d, via the match CAM circuit 200 such that when a representation of a binary value pair is input via one of the sets of match lines 250a-d, 255a-d to a corresponding selected set of comparators 260a-d, 265a-d, a match result indication is output on the condition that the input binary value pair representation matches the binary value pair stored in the pair of memory elements 220, 230.

The bit and bit bar lines, 220b, 230b and 220bb, 230bb, of the pair of memory elements 220, 230 are coupled to AND gates 240a, 240b, 240c, 240d of the decoder circuit 240. The decoder AND gates 240a, 240b, 240c, 240d preferably include input inverters to provide circuit isolation between the pair of memory elements 220, 230 and the decoder circuit 240. Outputs of the four decoder AND gates 240a, 240b, 240c, 240d define four comparison lines that are respectively coupled to a first set of comparators 260a, 260b, 260c, 260d of the comparator circuit 260 or a second set of comparators 265a, 265b, 265c, 265d of the comparator circuit 260 depending on a logical input to the multiplexor selection circuitry 290.

The multiplexor selection circuitry 290 includes a first set of selector AND gates 290a-d and a second set of selector AND gates 295a-d. Each selector AND gate includes an output inverter to provide circuit isolation between the multiplexor selection circuitry 290 and the comparator circuit 260 along with first and second inputs. The comparison line outputs of the four decoder AND gates 240a, 240b, 240c, 240d are each coupled to a first input of a respective selection AND gate of each of the two sets of selection AND gates 290a-d, 295a-d. An input line 297 of the multiplexor selection circuitry 290 is coupled to the second input of the first set selector AND gates 290a-d and to the input of an inverter 298. An inverted input line 299 of the multiplexor selection circuitry 290 is coupled to the output of the inverter 298 and the second input of the second set selector AND gates 295a-d. Accordingly, when the input line 297 of the multiplexor selection circuitry 290 is set high or "1" the first set selector AND gates 290a-d can pass a comparison signal to a respective first set comparator 260a, 260b, 260c or 260d and the second set selector AND gates 295a-d block the passage of a comparison signal to any of the second set comparators 265a-d. Similarly, when the input line 297 of the multiplexor selection circuitry 290 is set low or "0" the second set selector AND gates 295a-d can pass a comparison signal to a respective second set comparator 265a, 265b, 265c or 265d and the first set selector AND gates 290a-d block the passage of a comparison signal to any of the second set comparators 260a-d.

As only shown for comparator circuit 260a, the comparators 260a-d and 265a-d each include an AND gate 270a that has first and second inputs that each include an inverter to provide circuit isolation for the comparator circuit 260. A first input of AND gate 270a is coupled to the comparison line of the respective decoder AND gate 240a via selection AND gate 290a. Due to the output inverter of selection AND gate 290a and the input inverter of comparator AND gate 260a, the comparison value upon which the comparator AND gate 260a operates is logically the same as output from the decoder AND gate 240a. The other comparator AND gates are similarly coupled to a respective decoder AND gate 240a-d via the respective selection AND gate 290b-d, 295a-d. The second input of the comparator AND gates are each coupled to a respective match lines 250a-d, 255a-d.

The comparator AND gates (such as 270a) of each comparator 260a-d, 265a-d has an output coupled to control the operation of an NMOS transistor (such as 280a) that is configured to output a positive match value signal when it is operated. The NMOS transistors (such as 280a) output the positive match value signal to a common output line 285 of comparator circuit 260 when it is operated. Alternatively, in lieu of each comparator 260a-d, 265a-d having an NMOS transistor, the outputs of the comparator AND gates may be coupled, preferably via a logical OR coupling, to a single NMOS transistor (not shown) that outputs the positive match value signal from the comparator circuit 260 on comparator circuit output line 285.

As shown in FIG. 5b, the comparator circuit output line 285 is coupled to a first input of a decision AND gate 300. Preferably, the NMOS transistors output a logically inverted signal as the positive match value signal so that the decision AND gate 300 inputs include inverters for providing isolation to the comparator circuit 260. A second input of the decision AND gate 300 is coupled an output line 310 of a similar comparison circuit (not shown) associated with two other memory elements of the CAM array.

When both comparator circuit output lines 285, 310 provide positive match value signals, the decision AND gate 300 outputs a half array match value signal on line 310 to a first input of an array decision AND gate 330. A similar line 340 coupled to a second input of the array decision AND gate 330 provides the output from a decision AND gate with respect to corresponding circuitry associated with four other CAM array memory elements.

When both decision AND gate output lines 320, 340 provide half array match value signals, the array decision AND gate 330 outputs an array match value signal. Since the Execution Unit has two sets of pipeline registers, PRN0, PRN1, the CAM array match may be desired to be made with respect to either set of pipeline registers, PRN0, PRN1.

To do this efficiently the same CAM memory elements are preferably used for comparisons associated with either set of pipeline registers, PRN0, PRN1. For example, the eight comparators 260a-d, 265a-6 may be driven via eight inputs 250a-d, 255a-d by driven by the first set of pipeline registers, PRN0, and by memory elements 220, 230 via the outputs of the eight gates 290a-d, 295a-d. A second set of eight comparators (not shown) respectively coupled the outputs of the eight gates 290a-d, 295a-d and a second set of eight inputs (not shown) can be provided such that the second set of eight comparators (not shown) may be driven via second set of eight inputs (not shown) by the second set of pipeline registers, PRN1, and by memory elements 220, 230 via the outputs of the eight gates 290a-d, 295a-d, to produce an output reflecting a comparison from PRN1 corresponding to the output 285 that would however, reflecting a comparison from PRN0.

Such additional comparator and input sets are preferably provided for each of the four pairs of CAM memory elements of the preferred eight-bit CAM and are preferably coupled, in a manner corresponding to gate 300 and lines 310, 320 and 340, to an array decision AND gate 350. As a result, either the first set of pipeline registers, PRN0, can attempt to match the eight memory elements of the CAM by driving the circuit to have the array decision AND gate 330 output the array match value signal, or the second set of pipeline registers, PRN1, can attempt to match the eight memory elements of the CAM by driving the circuit to have the array decision AND gate 350 output the array match value signal. Accordingly, the outputs of the array decision AND gates 330, 350 are preferably coupled to inputs of an OR gate 360 that outputs a signal reflecting a match with respect to the CAM from either set of pipeline registers, PRN0, PRN1.

In operation, the decoder circuit 240 produces a comparison value on one of the comparison lines for any given binary value pair stored in the pair of memory elements 220, 230. Similarly, the match lines 250 provide a match value on one of the match lines for any given binary value pair to be compared.

As explained below, the output of a positive match result value from a comparator AND gate will only occur for one of the comparators when the pair of values stored in the pair of memory elements 220, 230 matches the represented binary value pair that is input to the selected set of comparator circuits 260a-d or 265a-d. Otherwise, the NMOS transistors 180a of the comparator circuits 260a-d, 265a-d will not be operated.

When a "0" is stored in one of the memory elements 220, 230, the bit line 220b, 230b is "low" i.e. "0" and the bit bar line 220bb, 230bb is "high" i.e. "1." When a "1" is stored in one of the memory elements 220, 230, the bit line 220b, 230b is "high" i.e. "1" and the bit bar line 220bb, 230bb is "low" i.e. "0." As a result, the stored values of the pair of memory elements 220, 230 is decoded into one of four vectors (1,0,0,0), (0,1,0,0), (0,0,1,0) or (0,0,0,1) that is output on the four comparison lines from the decoder AND gates 240a, 240b, 240c, 240d.

For example, when a (0,0) binary value pair is stored in pair of the memory elements 220, 230, the bit lines 220b, 230b are both "low" i.e. "0" and the bit bar lines 220bb, 230bb are both "high" i.e. "1." As a result, "0"s are input to both inverter inputs of decoder AND gate 240a resulting in an output value "1" and at least one "1" is input to one of the inverter inputs of the other three decoder AND gates 240b, 240c, 240d resulting in an output value "0". Thus, the stored value (0,0) in the pair of memory elements 220, 230, is decoded into the vector (1,0,0,0) being output on the four comparison lines from decoder AND gates 240a, 240b, 240c, 240d. Accordingly, for the stored value (0,0), decoder AND gate 240a produce the comparison value that is passed to the AND gate of comparator circuit 260a or 265a selected by the multiplexor selection circuitry 290 which effectively enables selected comparator 260a or 265a to make a comparison with a match value. In this case, the decoder AND gates 240b 240c, 240d all produce a "0" that do not enable any of the comparators 260b-d, 265,b-d to make comparisons while the multiplexor selection circuitry 290 prevents enablement the comparators of the set of comparators that is not selected.

When the representation of a binary value pair is input for comparison to a selected set of comparators 260a-d or 265a-d, an encoded version of the binary value pair is provided on the respective set of match lines 250a-d, 255a-d. The encoded version of the binary value pair corresponds to one of four vectors (1,0,0,0), (0,1,0,0), (0,0,1,0) or (0,0,0,1) where 1 corresponds to the match value. However, an inverted version of those vectors is supplied due to the invertors associated with the inputs of the comparator AND gates to which the respective match lines are coupled so that the match value is actually 0 from the match lines shown in FIG. 5a. Where no comparison is being made, the vector (0,0,0,0) can be input, that becomes inverted to (1,1,1,1), so no match value is provided from any of the match lines in that case.

For example, when the binary value pair (0,0) is to be compared to a stored binary value pair when the first set of comparators 260a-d is selected, the match line 250a provides a match value and the other three match lines 250b-d do not provide the match value. Accordingly, for the binary value pair (0,0), match line 250a provides the requisite match value input to the comparator AND gate 270a which effectively enables comparator 260a to make a comparison. None of match lines 250b-d provide the match value so that if one of the other comparators 260b-d is enabled by being provided with the comparison value, no positive match value is generated by the other comparator's AND gate.

For comparison against any binary value pair other than (0,0), the match line 250a does not provide the match value input to the comparator AND gate 270a and prevents the generation of a positive match value by AND gate 270a. Thus only when the stored binary value pair is (0,0) and the binary value pair to be compared is also (0,0) will a positive match value be generated by the comparator AND gate 270a when the first set of comparators 260a-d is selected. Similarly, only when the stored binary value pair is (0,1) and the binary value pair to be compared is also (0,1) will a positive match value be generated by the AND gate of comparator 260b when the first set of comparators 260a-d is selected; only when the stored binary value pair is (1,0) and the binary value pair to be compared is also (1,0) will a positive match value be generated by the AND gate of comparator 260c when the first set of comparators 260a-d is selected; and only when the stored binary value pair is (1,1) and the binary value pair to be compared is also (1,1) will a positive match value be generated by the AND gate of comparator 260d when the first set of comparators 260a-d is selected. Similarly, only when the stored binary value pair matches and the binary value pair to be compared will a positive match value be generated by one of the AND gates of second set of comparator 265a-d when the second set of comparators 265a-d is selected by the multiplexor selection circuitry 290.

Although features and elements are described above in particular combinations, each feature or element can be used alone without the other features and elements or in various combinations with or without other features and elements. The methods provided may be implemented in a general purpose computer, a processor or any IC that utilizes CAM arrays. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A method comprising:
   storing binary values in a pair of content addressable memory (CAM) elements;
   providing a comparison value to one of four comparison lines dependent on the binary value stored in the pair of CAM elements, each comparison line being associated with a match line;
   providing a match value to one selected match line of the match lines where the selected match line corresponds to a binary value pair to be compared with the value stored in the pair of CAM elements; and
   outputting a positive match result value via an output line on a condition that a comparison line has been provided with the comparison value and its associated match line has been provided with the match value.

2. The method of claim 1, where the four comparison lines are first, second, third and fourth comparison lines that are respectively associated with first, second, third and fourth match lines, wherein:
   the providing a comparison value is performed such that only the first comparison line is provided with the comparison value when a binary value of 00 is stored in the pair of CAM elements, only the second comparison line is provided with the comparison value when a binary value of 01 is stored in the pair of CAM elements, only the third comparison line is provided with the comparison value when a binary value of 10 is stored in the pair of CAM elements, and only the fourth comparison line is provided with the comparison value when a binary value of 11 is stored in the pair of CAM elements;
   the providing a match value is performed such that only the first match line is provided with the match value when a binary value of 00 is to be compared with the value stored in the pair of CAM elements, only the second match line is provided with the match value when a binary value of 01 is to be compared with the value stored in the pair of CAM elements, only the third match line is provided with the match value when a binary value of 10 is to be compared with the value stored in the pair of CAM elements, and only the fourth match line is provided with the match value when a binary value of 11 is to be compared with the value stored in the pair of CAM elements; and
   the positive match result value is output via an output line only on a condition that:
      the first comparison line has been provided with the comparison value and the first match line has been provided with the match value;
      the second comparison line has been provided with the comparison value the second match line has been provided with the match value;
      the third comparison line has been provided with the comparison value and the third match line has been provided with the match value; or
      the fourth comparison line has been provided with the comparison value and the fourth match line has been provided with the match value.

3. The method of claim 1 where the output lines are each associated with a transistor from which power is dissipated when a positive match result value is output whereby power is conserved when a positive match result value is not output.

4. A comparison method for a CAM array comprising performing the CAM element pair comparison method according to claim 3 with respect to a plurality of pairs of CAM elements.

5. The method of claim 4 where the CAM array includes four CAM element pairs further comprising providing a CAM match output on a condition that the positive match result value has been output with respect to at least three of the CAM element pairs.

6. A method of waking up CAM arrays in a processor core scheduler comprises performing the method according to claim 4 with respect to each array.

7. The method of claim 1 further comprising:
   selecting between first and second sets of four comparison lines associated with match lines of first and second sets of match lines, respectively;
   wherein:
      the providing the comparison value is performed with respect to at least the selected set of comparison lines;
      the providing a match value is performed with respect to at least the set match lines associated with the selected set of comparison lines; and
      the outputting a positive match result value via an output line on a condition that a comparison line of the selected set of comparison lines has been provided with the comparison value and its associated match line has been provided with the match value.

8. The method of claim 7 where the output lines are each associated with a transistor from which power is dissipated when a positive match result value is output whereby power is conserved when a positive match result value is not output.

9. A comparison method for a CAM array comprising performing the CAM element pair comparison method according to claim 8 with respect to a plurality of pairs of CAM elements.

10. The method of claim 9 where the CAM array includes four CAM element pairs further comprising providing a CAM match output on a condition that the positive match result value has been output with respect to at least three of the CAM element pairs.

11. A method of waking up CAM arrays in a processor core scheduler comprises performing the method according to claim 9 with respect to each array where the selection between comparison lines is based on whether the CAM array is being used for an address generation operation or an arithmetic operation.

12. A method of waking up CAM arrays in a processor core scheduler comprises performing the method according to claim 9 with respect to each CAM array where each CAM array includes four CAM element pairs.

13. The method of claim 12 further comprising, for each CAM array, providing a respective CAM match output on a condition that positive match result values have been output with respect to the four CAM element pairs of the respective CAM array.

14. An Integrated Circuit (IC) comprising a content addressable memory (CAM) element pair comparison circuit that includes:
a pair of CAM elements for storing binary values;
the pair of CAM elements being logically coupled with four comparison lines such that only one comparison line will have a comparison value, the one comparison line having a comparison value being dependent on which of four binary vales is stored in the pair of CAM elements;
a set of four match lines configured to receive a match value on only one of the four match lines for a comparison operation; and
each of the four comparison lines being logically paired with one of the four match lines to define four output lines such that a positive match result value is output via an output line only on a condition that its respective match line has received the match value and its respective comparison line has the comparison value.

15. The IC of claim 14 wherein:
each element of the pair of CAM elements have a bit line and a bit bar line configured to hold opposite values that are respectively a first value and a second value dependent on the binary value stored in the element; and
the bit and bit bar lines of the pair of CAM elements are logically coupled in four different combinations to the four comparison lines such that each comparison line will have the comparison value only when its respective bit and bit bar lines both hold the first value.

16. The IC of claim 14 wherein the four output lines of the CAM element pair comparison circuit are each associated with a transistor from which power is dissipated when a positive match result value is output whereby power is conserved when a positive match result value is not output.

17. An IC having a CAM circuit comprising a plurality of CAM element pair comparison circuits according to claim 16.

18. An IC having a CAM circuit comprising three CAM element pair comparison circuits according to claim 16 wherein the CAM circuit includes four CAM element pair comparison circuits that are logically coupled to provide a CAM match output only on a condition a positive match result signal is output for all four of the CAM element pair comparison circuits.

19. An IC having a processor core that includes a scheduler that comprises a plurality of CAM circuits according to claim 18.

20. The IC of claim 14 wherein the CAM element pair comparison circuit further includes:
a multiplex switch circuit configured to select between first and second sets of four comparison lines associated with match lines of respective sets of four match lines, such that one comparison line of either the first or second sets of comparison lines will have the comparison value;
both sets of four match lines being configured to receive a match value on only one of the four match lines for a comparison operation; and
each of the four comparison lines of each set being logically paired with one of the four match lines of the associated set to define four output lines such that the positive match result value is output via an output line only on a condition that its respective match line has received the match value and its respective comparison line has the comparison value, whereby the positive match result is output only with respect to a selected set of comparison lines and its associated set of match lines.

21. The IC of claim 20 wherein:
each element of the pair of CAM elements have a bit line and a bit bar line configured to hold opposite values that are respectively a first value and a second values dependent on the binary value stored in the element; and
the bit and bit bar lines of the pair of CAM elements are logically coupled in four different combinations to each set of the four comparison lines such that a comparison line of a selected set will have the comparison value only when its respective bit and bit bar lines both hold the first value.

22. The IC of claim 20 wherein the output lines of the CAM element pair comparison circuit are each associated with a transistor from which power is dissipated when a positive match result value is output whereby power is conserved when a positive match result value is not output.

23. An IC having a CAM circuit comprising a plurality of CAM element pair comparison circuits according to claim 22.

24. An IC having a CAM circuit comprising three CAM element pair comparison circuits according to claim 20 wherein the CAM circuit includes four CAM element pair comparison circuits that are logically coupled to provide a CAM match output only on a condition a positive match result signal is output for all four of the CAM element pair comparison circuit.

25. An IC having a processor core that includes a scheduler that comprises a plurality of CAM circuits according to claim 24.

26. The IC of claim 25 wherein the plurality of CAM circuits are wake up CAM circuits, the processor core scheduler includes a queue having a selected number of positions that each include four of the wake up CAM circuits, each wake up CAM circuit is used to address data registers of a set of addressable data registers used in the execution of instructions, and the wake up CAM circuits are configured to select between sets of comparison lines based on whether the wake up CAM circuit is being used for an address generation instruction or an arithmetic/logical instruction.

27. A method comprising:
storing binary value pair a pair of content addressable memory (CAM) elements;
providing a comparison signal to comparator circuitry that uniquely represents the stored binary values;
inputting a match signal to the comparator circuitry that uniquely represents a binary value pair to be compared with the stored binary value pair; and
operating a transistor to output a positive match result signal only on a condition that the comparison signal provided to the comparator circuitry and match signal input to the comparator circuitry represent the same binary value pair whereby no transistor of the comparator circuitry is operated when the comparison signal provided to the comparator circuitry and match signal input to the comparator circuitry represent different binary value pairs.

28. The method of claim 27 wherein:
the providing a comparison signal includes providing a comparison value to one of four comparison lines dependent on the binary value stored in the pair of CAM elements, each comparison line being associated with a match line of the comparator circuitry;

the inputting a match signal includes providing a match value to one selected match line of the match lines where the selected match line corresponds to the binary value pair to be compared with the stored binary value pair; and the operating a transistor to output a positive match result signal includes outputting a positive match result value via an output line to operate the transistor on a condition that a comparison line has been provided with the comparison value and its associated match line has been provided with the match value.

29. The method of claim 28 where the comparator circuitry includes four logic gates, each logic gate coupled with a different pair of comparison lines and match lines and each logic gate having a respective output line coupled with a respective NMOS transistor wherein the operating a transistor to output a positive match result signal includes operating the respective NMOS transistor coupled to the logic gate that outputs a positive match result value via its respective output line.

30. The method of claim 28 where the comparator circuitry includes four logic gates and an NMOS transistor as the transistor, each logic gate coupled with a different pair of comparison lines and match lines and each logic gate having a respective output line logically coupled with the NMOS transistor wherein the operating the transistor to output a positive match result signal includes operating the NMOS transistor on the condition that one of the logic gate that outputs a positive match result value via its respective output line.

* * * * *

UNITED STATES PATENT AND TRADEMARK OFFICE
CERTIFICATE OF CORRECTION

PATENT NO. : 8,570,783 B2 Page 1 of 1
APPLICATION NO. : 12/914538
DATED : October 29, 2013
INVENTOR(S) : Venkataramanan et al.

It is certified that error appears in the above-identified patent and that said Letters Patent is hereby corrected as shown below:

IN THE CLAIMS:

Claim 2, column 14, line 10, after "value" insert -- and --.

Claim 14, column 15, line 18, change "vales" to -- values --.

Claim 21, column 16, line 11, change "values" to -- value --.

Claim 24, column 16, line 32, change "circuit" to -- circuits --.

Claim 27, column 16, line 47, change "value pair" to -- values in --.

Claim 30, column 17, line 30, change "gate" to -- gates --.

Signed and Sealed this
Twenty-fifth Day of February, 2014

Michelle K. Lee
*Deputy Director of the United States Patent and Trademark Office*